United States Patent
Huang (10) Patent No.: US 9,407,277 B2
(45) Date of Patent: Aug. 2, 2016

(54) SUCCESSIVE APPROXIMATION ANALOG-TO-DIGITAL CONVERTER AND CONVERSION METHOD

(71) Applicant: REALTEK SEMICONDUCTOR CORPORATION, Hsinchu (TW)

(72) Inventor: Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/876,695

(22) Filed: Oct. 6, 2015

(65) Prior Publication Data

US 2016/0126966 A1 May 5, 2016

(30) Foreign Application Priority Data

Nov. 3, 2014 (TW) ............................. 103137962 A (51) Int. Cl.
*H03M 1/00* (2006.01)
*G04F 10/00* (2006.01)
(Continued)

(52) U.S. Cl.
CPC ............. *H03M 1/002* (2013.01); *G04F 10/005* (2013.01); *H03M 1/1245* (2013.01); *H03M 1/38* (2013.01)

(58) Field of Classification Search
CPC ..... H03M 1/1215; H03M 1/442; H03M 1/34; H03M 1/46; H03M 1/06; H03M 1/0697; H03M 3/402; H03M 3/496; H03M 3/354; H03M 3/424; H03M 3/422; H03M 3/372; H03M 3/454; H04L 7/02; H04L 7/027; H04L 7/044; H04L 7/0331

USPC ................... 341/118–155; 375/295, 316, 354
See application file for complete search history.

(56) References Cited

U.S. PATENT DOCUMENTS 5,181,033 A * 1/1993 Yassa ................. H03H 17/0664
341/143
5,241,310 A * 8/1993 Tiemann ............... H03M 3/382
341/139
(Continued)

FOREIGN PATENT DOCUMENTS

TW            201444298         11/2014

OTHER PUBLICATIONS

TW 201444298 is also published as U.S. Pat. No. 8,912,942.
(Continued)

*Primary Examiner* — Lam T Mai
(74) *Attorney, Agent, or Firm* — WPAT, P.C., Intellectual Property Attorneys; Anthony King (57) ABSTRACT

The present invention discloses a successive approximation analog-to-digital converter capable of improving the accuracy of analog-to-digital conversion. An embodiment of this converter comprises: a successive approximation analog-to-digital converting circuit operable to generate M bits according to an analog input signal in which the M bits include a most significant bit (MSB) and successive M−1 bit(s) in succession to the MSB while the number M is an integer greater than one; and a multi-bit generating circuit operable to receive a capacitor array output signal and a comparison signal outputted from the successive approximation analog-to-digital converting circuit for a predetermined time after the generation of the M bits, and then generate N bits at a time accordingly in which the N bits include a least significant bit (LSB) and successive N−1 bit(s) ahead of the LSB while the number N is an integer greater than one.

20 Claims, 9 Drawing Sheets

(51) Int. Cl.
*H03M 1/38* (2006.01)
*H03M 1/12* (2006.01)

(56) References Cited

U.S. PATENT DOCUMENTS

| | | | | |
|---|---|---|---|---|
| 5,262,779 | A * | 11/1993 | Sauer | H03K 5/2481 327/362 |
| 5,272,481 | A * | 12/1993 | Sauer | H03M 1/0602 327/63 |
| 5,508,715 | A * | 4/1996 | Kuroki | H03K 17/693 345/50 |
| 7,265,694 | B2 * | 9/2007 | Guidry | H03M 1/1285 324/76.15 |
| 8,587,466 | B2 * | 11/2013 | Debnath | H03M 1/145 341/155 |
| 8,618,975 | B2 * | 12/2013 | Nys | H03M 1/144 341/139 |
| 8,749,412 | B1 | 6/2014 | Tsai | |
| 8,872,691 | B1 * | 10/2014 | Stepanovic | H03M 1/06 341/144 |
| 8,912,942 | B2 | 12/2014 | Lin et al. | |
| 9,219,492 | B1 * | 12/2015 | Lok | H03M 1/002 |
| 9,231,611 | B2 * | 1/2016 | Steensgaard-Madsen | H03M 1/0668 |
| 2012/0213531 | A1 * | 8/2012 | Nazarathy | H03M 1/145 398/202 |

OTHER PUBLICATIONS

Pieter Harpe et al., ISSCC 2013/ Session 15/ Data Converter Techniques/ 15.2, A 2.2/2.7fJ/conversion-step 10/12b 40kS/s SAR ADC with Data-Driven Noise Reduction.

Takashi Morie et al., ISSCC 2013/ Session 15/ Data Converter Techniques/ 15.3, A 71dB-SNDR 50MS/s 4.2mW CMOS SAR ADC by SNR Enhancement Techniques Utilizing Noise.

* cited by examiner

SUCCESSIVE APPROXIMATION ANALOG-TO-DIGITAL CONVERTER AND CONVERSION METHOD

BACKGROUND OF THE INVENTION

1. Field of the Invention

The present invention relates to an analog-to-digital conversion technique, especially to a successive approximation analog-to-digital conversion technique.

2. Description of Related Art

A successive approximation analog-to-digital converter is operable to do binary search over an analog input signal according to all quantitative levels available to the converter and accordingly generate a digital output signal. Among many kinds of successive approximation analog-to-digital converters, a charge redistribution successive approximation analog-to-digital converter is a common choice. This kind of converter uses a capacitor array to sample an analog input signal, then couples the bottom electrode plates of capacitors in the capacitor array to a predetermined voltage one by one according to the descending order of the capacities of the capacitors in view of an instant feedback comparison result so as to gradually decrease the output voltage of the capacitor array (i.e., the voltage of the electrode plates of the capacitors), afterwards compares the output voltage of the capacitor array with the output voltage of an analog-to-digital converting unit (e.g., another capacitor array) or a constant voltage to generate the mentioned instant comparison result, and generates a digital output signal composed of plural bits from a most significant bit (MSB) to a least significant bit (LSB) according to all of the comparison results.

In light of the above, a charge redistribution successive approximation analog-to-digital converter generates a digital output signal composed of bits from a MSB to a LSB by order through many times of voltage comparison. However, based on the principle of successive approximation analog-to-digital conversion, during the last one or few procedures of voltage comparison, the output voltage of the capacitor array will be less and less; consequently, the output voltage tends to being sensitive to noise, and thus the last one or few voltage comparison results could be unreliable, which means that the value of the LSB or the values of the last few bits could be wrong. In order to solve this problem, some prior art generates a bit (e.g., the LSB or one of the last few bits) according to a majority vote of several comparison results, so as to reduce the weight of noise. However, this kind of prior art consumes too much time for the acquisition of extra comparison results (while a lot of time is consumed in the reset of comparator and the procedure of waiting to be reset), and therefore leads to the decrease of analog-to-digital conversion rate and the increase of power consumption. People who are interested in the prior art may refer to the following documents:

(1) U.S. Pat. No. 8,749,412.
(2) U.S. patent application Ser. No. 14/183,637.
(3) Pieter Harpe, Eugenio Cantatore, Arthur van Roermund, "A 2.2/2.7fJ/conversion-step 10/12b 40 kS/s SAR ADC with Data-Driven Noise Reduction", ISSCC 2013/SESSION 15/DATA CONVERTER TECHNIQUES/15.2.
(4) Takashi Morie, Takuji Miki, Kazuo Matsukawa, Yoji Bando, Takeshi Okumoto, Koji Obata, Shiro Sakiyama, Shiro Dosho, "A 71 dB-SNDR 50 MS/s 4.2 mW CMOS SAR ADC by SNR Enhancement Techniques Utilizing Noise", ISSCC 2013/SESSION 15/DATA CONVERTER TECHNIQUES/15.3.

In addition to the charge redistribution successive approximation analog-to-digital converter, other kinds of successive approximation analog-to-digital converters have similar problems or other problems. Since these kinds of converters and the problems thereof are known in this field, the details thereof is omitted.

SUMMARY OF THE INVENTION

An object of the present invention is to provide a successive approximation analog-to-digital converter and conversion method capable of making improvements over the prior art.

The present invention discloses a successive approximation analog-to-digital converter capable of improving the accuracy of analog-to-digital conversion. An embodiment of the converter comprises: a successive approximation analog-to-digital converting circuit operable to generate M bits according to an analog input signal in which the M bits include a most significant bit (MSB) and successive M−1 bit(s) in succession to the MSB while M is an integer greater than one; and a multibit generating circuit operable to generate N bits after the generation of the M bits in which the N bits include a least significant bit (LSB) and successive N−1 bit(s) ahead of the LSB while N is an integer greater than one. In this embodiment, the multibit generating circuit includes: an accumulation signal generating circuit operable to accumulate a capacitor array output signal and a comparison signal from the successive approximation analog-to-digital converting circuit after the generation of the M bits and thereby generate an accumulation signal; and a multibit analog-to-digital converting circuit operable to generate the N bits according to the accumulation signal.

The present invention also discloses a successive approximation analog-to-digital conversion method capable of improving the accuracy of analog-to-digital conversion. An embodiment of the method comprises the following steps: generating M bits according to an analog input signal in which the M bits include a most significant bit (MSB) and successive M−1 bit(s) in succession to the MSB while M is an integer greater than one; generating a capacitor array output signal according to the analog input signal after the generation of the M bits; accumulating the capacitor array output signal and a comparison signal and thereby generating an accumulation signal; and generating N bits according to the accumulation signal in which the N bits include a least significant bit (LSB) and successive N−1 bit(s) ahead of the LSB while N is an integer greater than one.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this invention field. If any term is defined in this specification, such term should be explained accordingly.

The present invention comprises a successive approximation analog-to-digital converter and conversion method capable of preventing noise interference and improving the accuracy of analog-to-digital conversion. The present invention is applicable to an integrated circuit (e.g., an analog-front-end circuit) and a system device (e.g., a decoding device). Provided that an alternative means is available and reasonable, people of ordinary skill in the art can use such means similar or equivalent to that described in this specification to carry out the present invention. On account of that some element of the converter of the present invention could be known, the detail of such element is omitted provided that this omission nowhere dissatisfies the specification and enablement requirements. Besides, the conversion method of the present invention can be in the form of firmware and/or software which could be carried out by the converter of the present invention or the equivalent thereof. It should be noted that if an implementation derived from one or more of the embodiments in the following description is practicable, a person of ordinary skill in the art can selectively make use of some or all of the features in one embodiment or selectively make use of the combination of some or all features in several embodiments to have the implementation come true, so as to increase the flexibility of carrying out the present invention.

Figure 1:
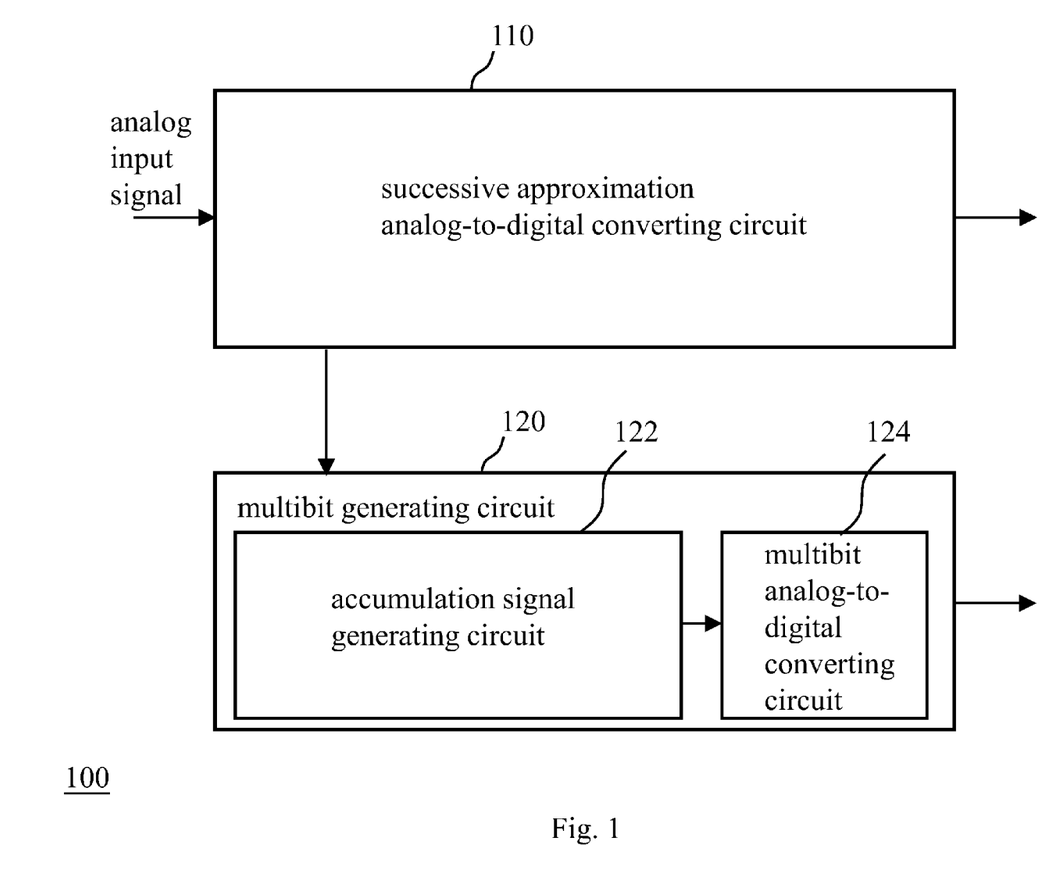
FIG. 1 illustrates an embodiment of the successive approximation analog-to-digital converter of the present invention.
Figure 2:
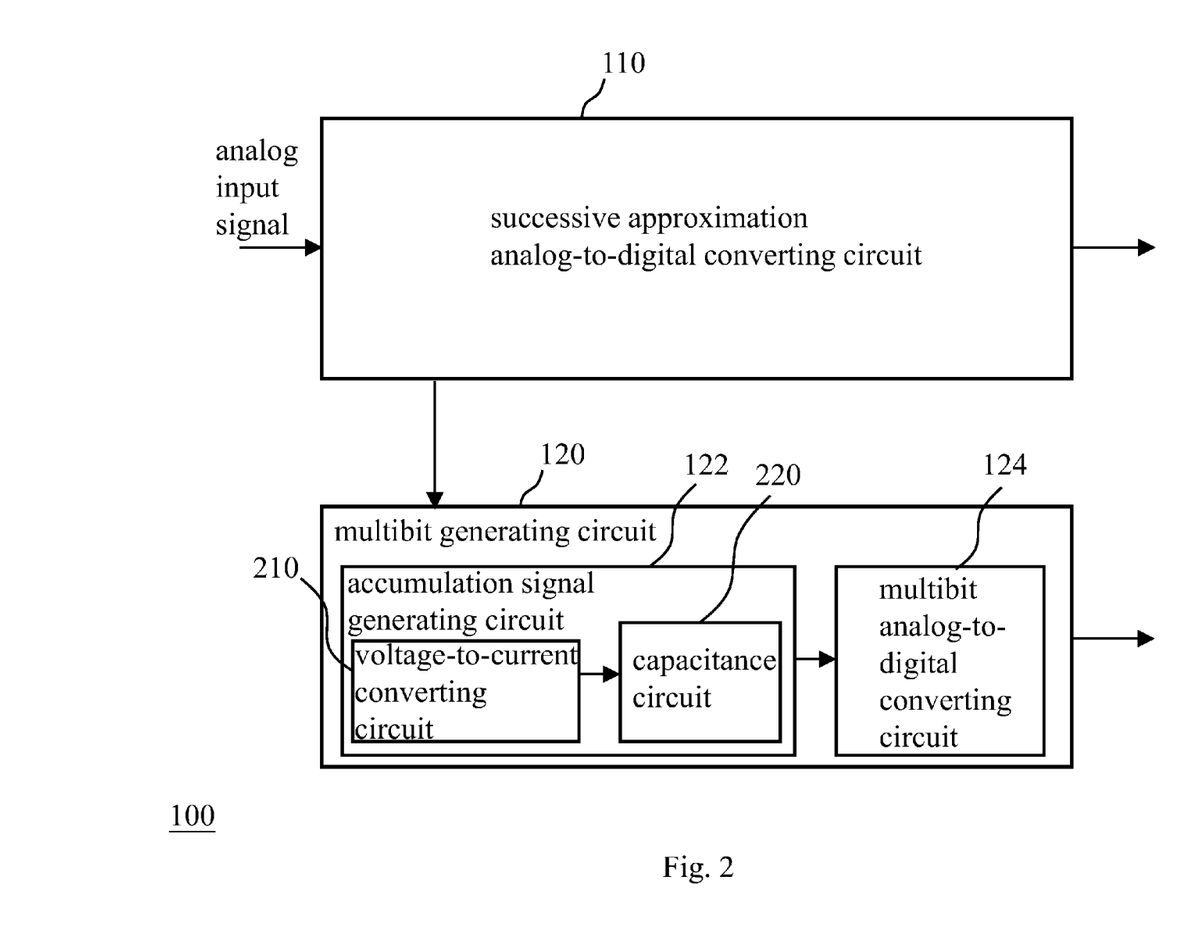
FIG. 2 illustrates an exemplary implementation of the accumulation signal generating circuit of FIG. 1.

Please refer to FIG. 1 which illustrates an embodiment of the successive approximation analog-to-digital converter of the present invention. As it is shown in FIG. 1, the successive approximation analog-to-digital converter 100 in the embodiment comprises: a successive approximation analog-to-digital converting circuit 110 operable to generate M bits according to an analog input signal in which the M bits include a most significant bit (MSB) and successive M−1 bit(s) in succession to the MSB while M is an integer greater than one; and a multibit generating circuit 120 operable to generate N bits after the generation of the M bits in which the N bits include a least significant bit (LSB) and successive N−1 bit(s) ahead of the LSB while N is an integer greater than one. In this embodiment, the successive approximation analog-to-digital converting circuit 110 can be a known or a self-developed converter, and the multibit generating circuit 120 includes: an accumulation signal generating circuit 122 operable to accumulate a capacitor array output signal and a comparison signal from the successive approximation analog-to-digital converting circuit 110 after the generation of the M bits (, which means that the circuit 122 receives the capacitor array output signal and the comparison signal for a predetermined time while the predetermined time could be the time for the converting circuit 110 generating a plurality of bits (e.g., N bits)) and thereby generate an accumulation signal; and a multibit analog-to-digital converting circuit 124 operable to generate the N bits according to the accumulation signal. An exemplary implementation of the accumulation signal generating circuit 122 is shown in FIG. 2, comprising: a voltage-to-current converting circuit 210 (e.g., a transconductance circuit or the equivalent thereof) operable to generate at least one current signal according to the capacitor array output signal and the comparison signal; and a capacitance circuit 220 operable to generate at least one voltage signal to be the accumulation signal according to the at least one current signal. Since the accumulation signal is the accumulation result of weak capacitor array output signals rather than a single weak capacitor array output signal, the accumulation signal is able to reflect N bits instead of one single bit and resist interference from instant noise, and accordingly reduces the bit error rate and improves the accuracy of analog-to-digital conversion. In other words, based on the characteristic of successive approximation analog-to-digital conversion, the signal intensity of the early-generated signals (e.g., the antecedent capacitor array output signals or the equivalent thereof) for generating the M bits is relatively strong while the signal intensity of the late-generated capacitor array output signals for generating the N bits are relatively weak, and thus the present invention compensates for the problem of weak signal intensity (i.e., the problem of low signal-to-noise ratio (SNR)) in the manner of signal accumulation.

Figure 3:
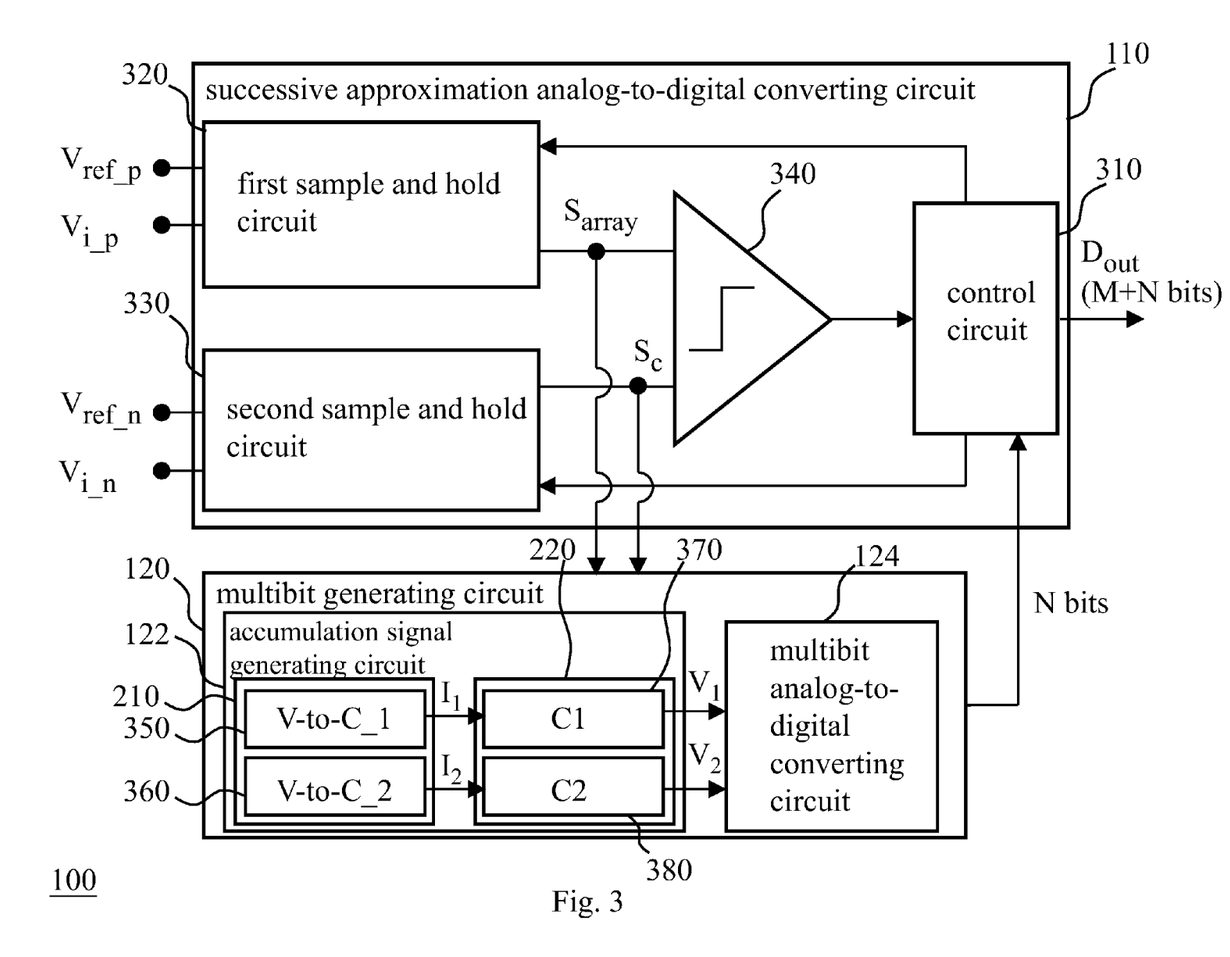
FIG. 3 illustrates an exemplary implementation of the successive approximation analog-to-digital converter of FIG. 1.

The aforementioned analog input signal could be a differential signal or a single-ended signal. As it is shown in FIG. 3, providing the analog input signal is a differential signal, the successive approximation analog-to-digital converting circuit 110 includes: a control circuit 310 operable to output a M+N bits digital output signal $D_{out}$ according to the M bits and the N bits; a first sample and hold circuit 320 operable to generate the capacitor array output signal $S_{array}$ according to a first signal $V_{i\_p}$ of the analog input signal and a first reference signal $V_{ref\_p}$ under the control of the control circuit 310; a second sample and hold circuit 330 operable to generate the comparison signal $S_c$ according to a second signal $V_{i\_n}$ of the analog input signal and a second reference signal $V_{ref\_n}$ under the control of the control circuit 310; and a comparing circuit 340 operable to generate the M bits one by one (that is to say one bit at a time) according to the capacitor array output signal $S_{array}$ and the comparison signal $S_c$. Besides, the voltage-to-current converting circuit 210 includes: a first voltage-to-current converting unit 350 (V-to-C_1) operable to generate a first current signal $I_1$ according to the capacitor array output signal $S_{array}$; and a second voltage-to-current converting unit 360 (V-to-C_2) operable to generate a second current signal $I_2$ according to the comparison signal $S_c$. Furthermore, the capacitance circuit 220 includes: a first capacitance unit 370 (C1) operable to generate a first voltage signal $V_1$ according to the first current signal $I_1$; and a second capacitance unit 380 (C2) operable to generate a second voltage signal $V_2$ according to the second current signal $I_2$.

Figure 4:
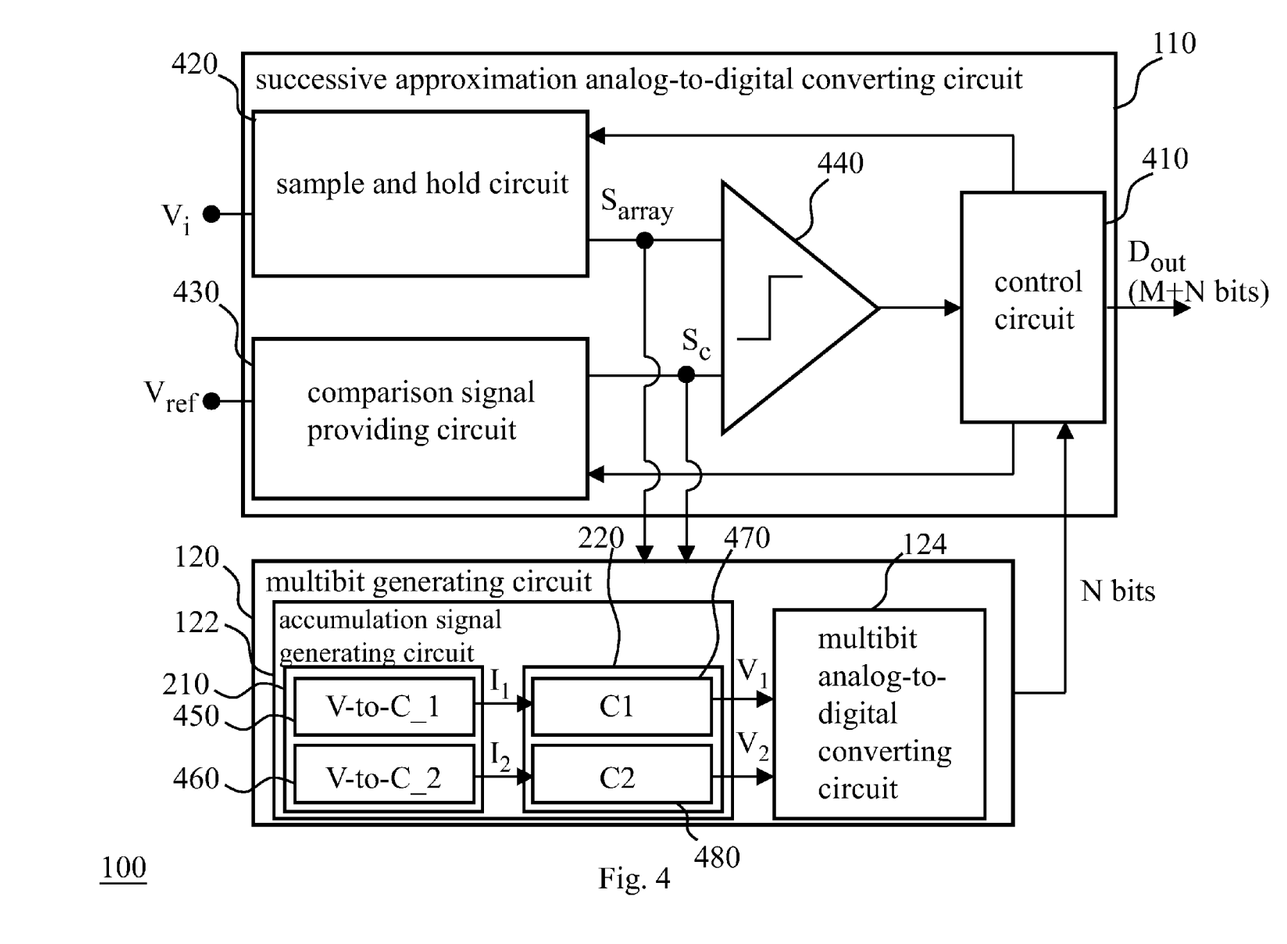
FIG. 4 illustrates another exemplary implementation of the successive approximation analog-to-digital converter of FIG. 1.

As it is shown in FIG. 4, providing the analog input signal is a single-ended signal, the successive approximation analog-to-digital converting circuit 110 includes: a control circuit 410 operable to output a M+N bits digital output signal $D_{out}$ according to the M bits and the N bits; a sample and hold circuit 420 operable to generate the capacitor array output signal $S_{array}$ according to the analog input signal $V_i$ and a reference signal $V_{ref}$ under the control of the control circuit 410; a comparison signal providing circuit 430 operable to provide a constant signal (such as a predetermined signal or a sampled signal of the analog input signal $V_i$) to be the comparison signal $S_c$; and a comparing circuit 440 operable to generate the M bits one by one according to the capacitor array output signal $S_{array}$ and the comparison signal $S_c$. Similarly, the voltage-to-current converting circuit 210 includes: a first voltage-to-current converting unit 450 (V-to-C_1) operable to generate a first current signal $I_1$ according to the capacitor array output signal $S_{array}$; and a second voltage-to-current converting unit 460 (V-to-C_2) operable to generate a second current signal $I_2$ according to the comparison signal $S_c$. Furthermore, the capacitance circuit 220 includes: a first capacitance unit 470 (C1) operable to generate a first voltage signal $V_1$ according to the first current signal $I_1$; and a second capacitance unit 480 (C2) operable to generate a second voltage signal $V_2$ according to the second current signal $I_2$.

Figure 5:
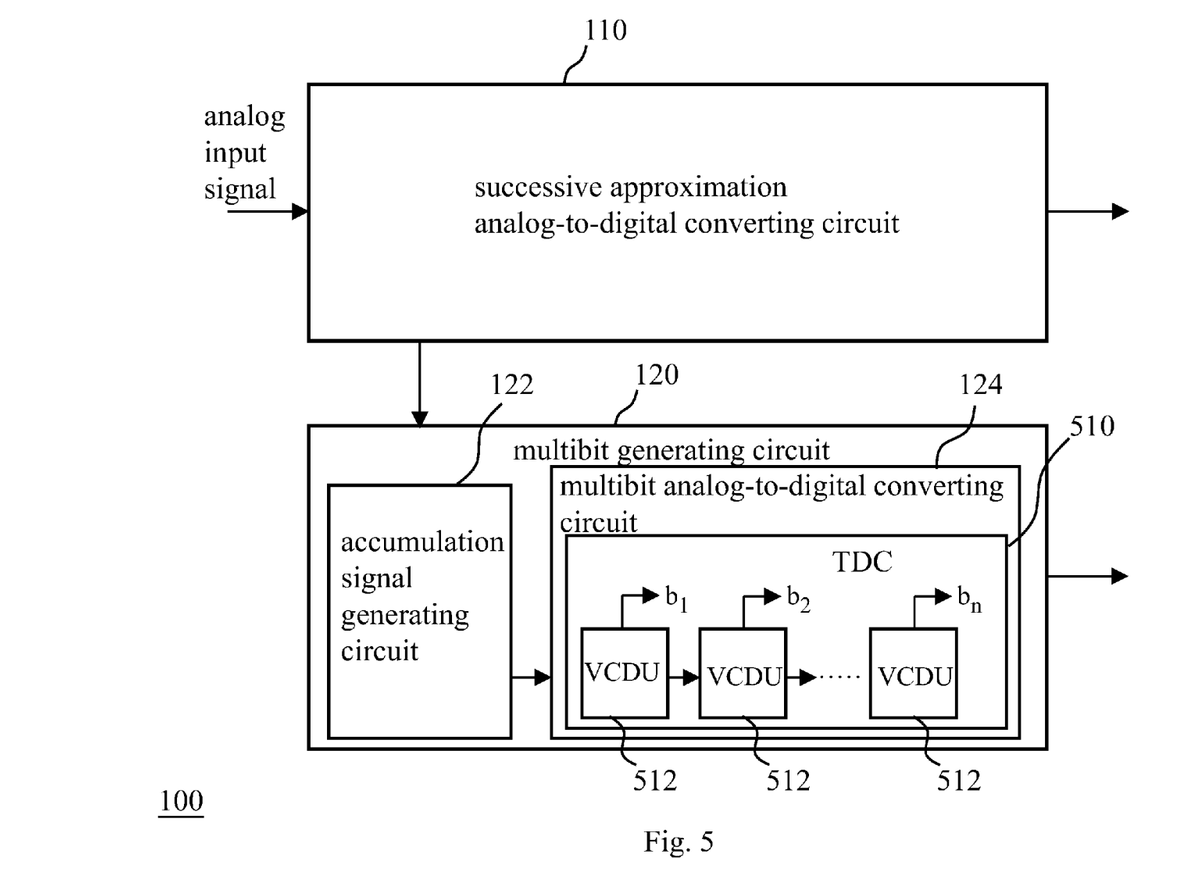
FIG. 5 illustrates an exemplary implementation of the multibit analog-to-digital converting circuit of FIG. 1.
Figure 6:
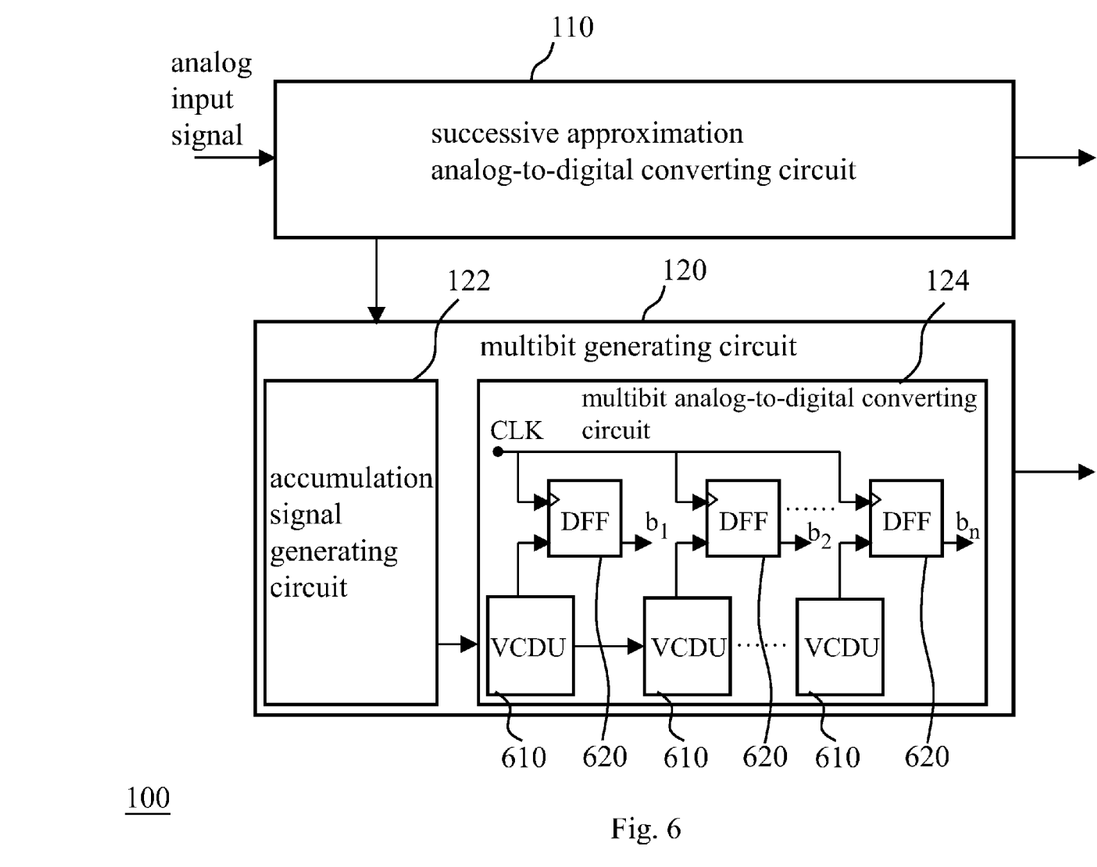
FIG. 6 illustrates another exemplary implementation of the multibit analog-to-digital converting circuit of FIG. 1.
Figure 7:
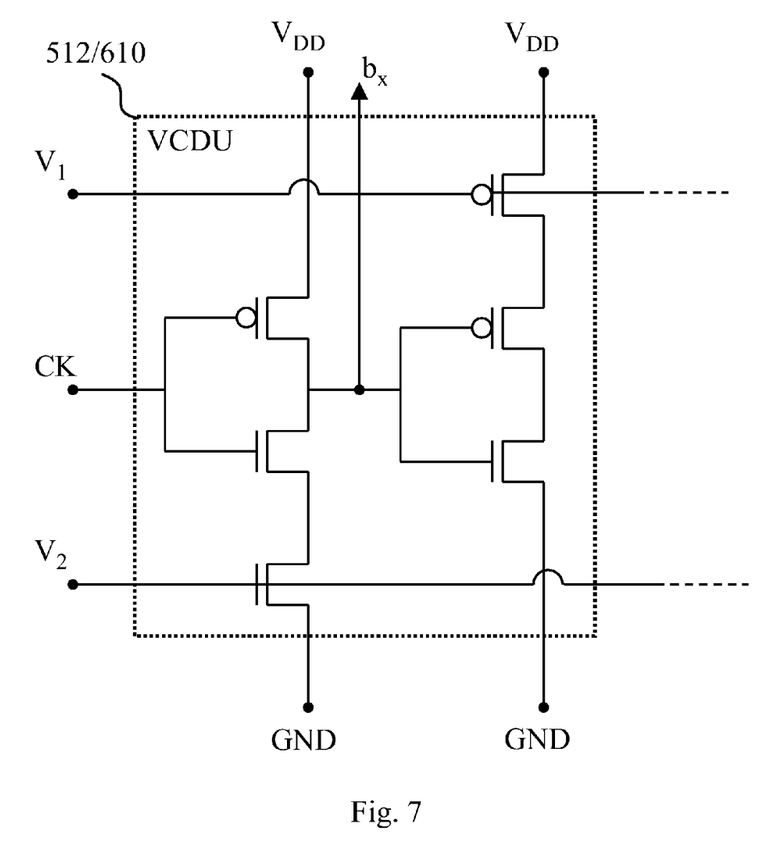
FIG. 7 illustrates an exemplary implementation of the voltage controlled delay units of FIG. 5 and FIG. 6.

The aforementioned multibit analog-to-digital converting circuit 124 could be realized through a time-to-digital converter (TDC). More specifically, as it is shown in FIG. 5, the said time-to-digital converter 510 includes: a plurality of cascaded voltage controlled delay units (VCDUs) (e.g., N units) operable to generate the N bits (e.g., $b_1, b_2, \ldots, b_n$) according to the at least one voltage signal. The time-to-digital converter 510 may include a detecting unit (e.g., a known phase detecting unit not shown in FIG. 5) operable to generate a notification signal according to a bit $b_n$ to allow the successive approximation analog-to-digital converting 110 to carry out the following procedure; however, this notification operation could be replaced by operations of other circuits (e.g., the clock circuit 810 of FIG. 8). In addition to the time-to-digital converter, the multibit analog-to-digital converting circuit 124 can be realized through other means. For instance, as it is shown in FIG. 6, the multibit analog-to-digital converter 124 includes: a plurality of cascaded voltage controlled delay units 610 (VCDUs) operable to generate N output signals one by one according to the at least one voltage signal; and N buffer units 620 (DFFs) (such as D-type flip-flops or the equivalent thereof) operable to store the N output signals respectively and afterwards output the N bits at a time according to a trigger signal (CLK) (such as an edge of a clock signal or the equivalent thereof). Any of the above-mentioned voltage controlled delay units 512/610 could be realized through a known configuration as shown in FIG. 7 in which $V_1$ and $V_2$ are the aforementioned first and second voltages, CK stands for a working clock, $b_x$ stands for any of the N bits (e.g., $b_1, b_2, \ldots, b_n$), and $V_{DD}$ and GND stand for operation voltages. Other kinds of voltage controlled delay unit having equivalent function are applicable to the present invention.

Figure 8:
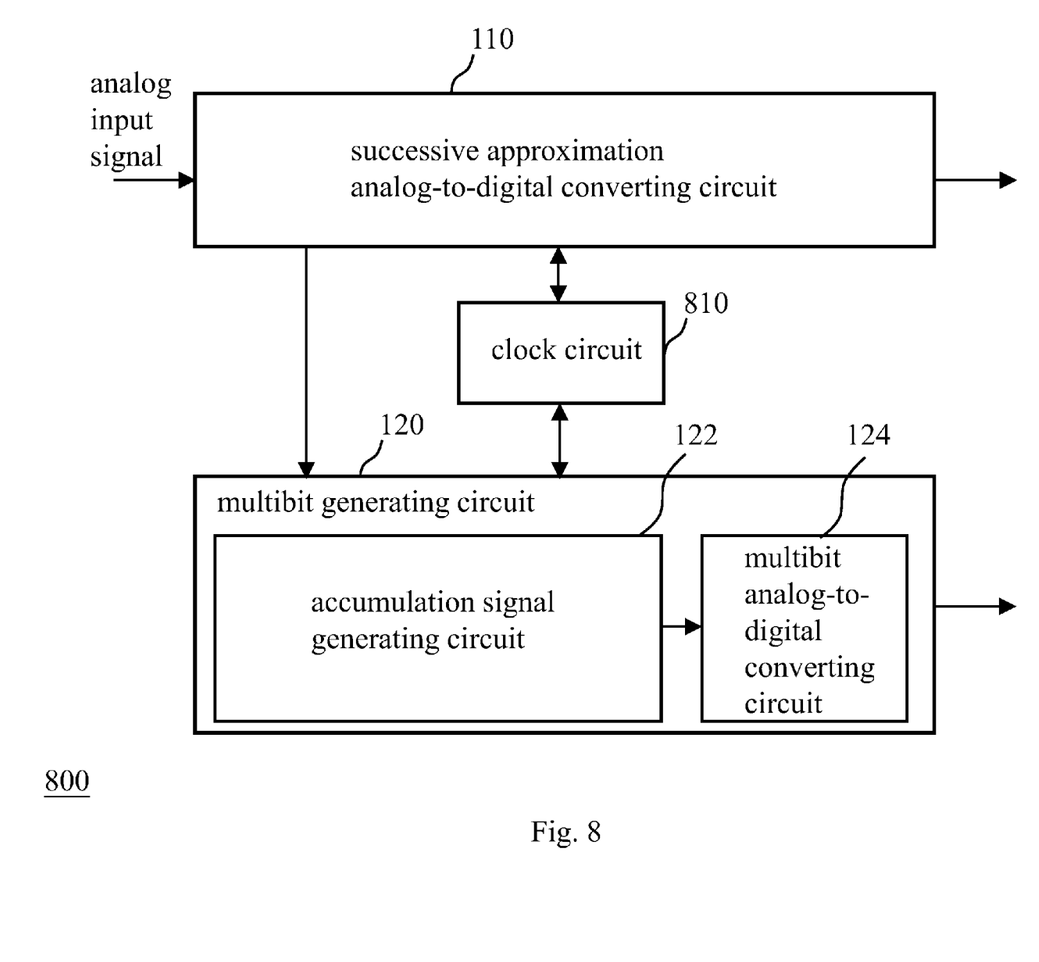
FIG. 8 illustrates another embodiment of the successive approximation analog-to-digital converter of the present invention.

Please refer to FIG. 8. In order to control the successive approximation analog-to-digital converting circuit 110 and the multibit generating circuit 120 to generate the M bits and the N bits respectively, the successive approximation analog-to-digital converter 800, compared with the converter 100 of FIG. 1, further comprises: a clock circuit 810 operable to provide a clock signal for the successive approximation analog-to-digital converting circuit 110, so as to allow the converting circuit 110 to generate the M bits according to the clock signal and the analog input signal, and generate the aforementioned capacitor array output signal after the generation of the M bits. After the generation of the M bits, the clock circuit 810 may further start or stop providing another clock signal for the multibit analog-to-digital converting circuit 124 according to the instruction from the converting circuit 110 or an internal timing control, so as to make the multibit analog-to-digital converting circuit 124 generate the N bits according to the another clock signal and the aforementioned accumulation signal. The characteristics of the mentioned two clock signals may be similar or different, and of course the aforementioned trigger signal (CLK) of FIG. 6 may originate from the clock circuit 810. In addition, after the generation of the N bits, the multibit generating circuit 120 may feed a signal back to the clock circuit 810 to make it carry out the following procedure; however, this is not a must because the clock circuit 810 may determine the beginning and ending timing of each operation stage in accordance with the output clock of the circuit 810 itself.

Figure 9:
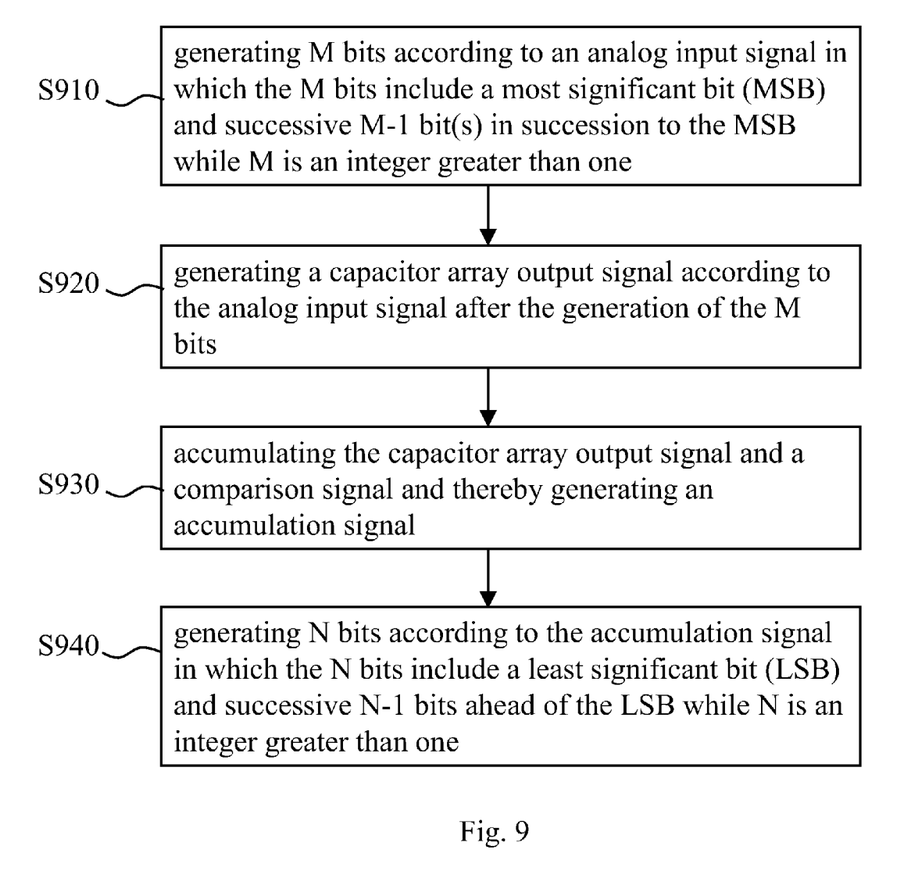
FIG. 9 illustrates an embodiment of the successive approximation analog-to-digital conversion method of the present invention.

In addition to the above-disclosed device, the present invention also discloses a successive approximation analog-to-digital conversion method capable of reducing noise interference and improving the accuracy of analog-to-digital conversion. As it is shown in FIG. 9, an embodiment of the method comprises:

Step S910: generating M bits according to an analog input signal in which the M bits include a most significant bit (MSB) and successive M−1 bit(s) in succession to the MSB while M is an integer greater than one. This step can be carried out by the aforementioned successive approximation analog-to-digital converting circuit 110 or the equivalent thereof.

Step S920: generating a capacitor array output signal according to the analog input signal after the generation of the M bits. This step can be carried out by the aforementioned successive approximation analog-to-digital converting circuit 110 or the equivalent thereof.

Step S930: accumulating the capacitor array output signal and a comparison signal and thereby generating an accumulation signal. This step can be carried out by the aforementioned accumulation signal generating circuit 122 or the equivalent thereof.

Step S940: generating N bits according to the accumulation signal in which the N bits include a least significant bit (LSB) and successive N−1 bit(s) ahead of the LSB while N is an integer greater than one. This step can be carried out by the aforementioned multibit analog-to-digital converting circuit 124 or the equivalent thereof.

Since those of ordinary skill in the art can appreciate the implementation detail and the modification thereof of this method invention by referring to the fore-illustrated device invention, which means that the feature of the device invention can be applied to the method invention in an reasonable way, repeated and redundant description is therefore omitted provided that the remaining disclosure is still enough for understanding and enablement. It should be noted that the shape, size, and ratio of any element and the step sequence of any flow chart in the figures are just exemplary for understanding, not for limiting the scope of this invention.

To sum up, the successive approximation analog-to-digital converter and conversion method are operable to accumulate a weak analog input signal for a predetermined time and then execute multibit analog-to-digital conversion, so as to reduce the influence of noise on the analog input signal and the bit error rate. In brief, the present invention includes at least one of the following advantages: uncomplicated and achievable design without high design or production cost; and better conversion rate and power-saving performance without wasting time and power on extra comparison operations such as those of the prior art using majority vote.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:
1. A successive approximation analog-to-digital converter capable of improving the accuracy of analog-to-digital conversion, comprising:

a successive approximation analog-to-digital converting circuit operable to generate M bits according to an analog input signal in which the M bits include a most significant bit (MSB) and successive M−1 bit(s) in succession to the MSB while M is an integer greater than one; and a multibit generating circuit including:

an accumulation signal generating circuit operable to accumulate a capacitor array output signal and a comparison signal from the successive approximation analog-to-digital converting circuit after the generation of the M bits and thereby generate an accumulation signal; and a multibit analog-to-digital converting circuit operable to generate N bits according to the accumulation signal in which the N bits include a least significant bit (LSB) and successive N−1 bit(s) ahead of the LSB while N is an integer greater than one.

2. The successive approximation analog-to-digital converter of claim 1, wherein the comparison signal is another capacitor array output signal or a constant signal.

3. The successive approximation analog-to-digital converter of claim 1, wherein the accumulation signal generating circuit includes:

a voltage-to-current converting circuit operable to generate at least one current signal according to the capacitor array output signal and the comparison signal; and a capacitance circuit operable to generate at least one voltage signal to be the accumulation signal in accordance with the at least one current signal.

4. The successive approximation analog-to-digital converter of claim 3, wherein the voltage-to-current converting circuit includes:

a first voltage-to-current converting unit operable to generate a first current signal according to the capacitor array output signal; and a second voltage-to-current converting unit operable to generate a second current signal according to the comparison signal, and the capacitance circuit includes:

a first capacitance unit operable to generate a first voltage signal according to the first current signal; and a second capacitance unit operable to generate a second voltage signal according to the second current signal.

5. The successive approximation analog-to-digital converter of claim 3, wherein the multibit analog-to-digital converting circuit includes: a time-to-digital converter operable to generate the N bits according to the at least one voltage signal.

6. The successive approximation analog-to-digital converter of claim 5, wherein the time-to-digital converter includes:

a plurality of voltage controlled delay units operable to generate the N bits according to the at least one voltage signal.

7. The successive approximation analog-to-digital converter of claim 1, wherein the multibit analog-to-digital converting circuit includes:

a plurality of voltage controlled delay units operable to generate N output signals according to the at least one voltage signal; and N buffer units operable to store the N output signals respectively, and then output the N bits at a time according to a trigger signal.

8. The successive approximation analog-to-digital converter of claim 1, further comprises:

a clock circuit operable to provide a clock signal for the successive approximation analog-to-digital converting circuit, so as to make the successive approximation analog-to-digital converting circuit generate the M bits according to the clock signal and the analog input signal and generate the capacitor array output signal after the generation of the M bits, wherein after the generation of the M bits, the clock circuit is operable to start providing another clock signal for the multibit analog-to-digital converting circuit to generate the N bits according to the another clock signal and the accumulation signal.

9. The successive approximation analog-to-digital converter of claim 1, wherein the successive approximation analog-to-digital converting circuit includes:

a control circuit operable to output a M+N bits digital output signal according to the M bits and the N bits;

a first sample and hold circuit operable to generate the capacitor array output signal according to a first signal of the analog input signal and a first reference signal under the control of the control circuit;

a second sample and hold circuit operable to generate the comparison signal according to a second signal of the analog input signal and a second reference signal under the control of the control circuit; and a comparing circuit operable to generate the M bits according to the capacitor array output signal and the comparison signal.

10. The successive approximation analog-to-digital converter of claim 1, wherein the successive approximation analog-to-digital converting circuit includes:

a control circuit operable to output a M+N bits digital output signal according to the M bits and the N bits;

a sample and hold circuit operable to generate the capacitor array output signal according to the analog input signal and a reference signal under the control of the control circuit;

a comparison signal providing circuit operable to provide a constant signal to be the comparison signal; and a comparing circuit operable to generate the M bits according to the capacitor array output signal and the comparison signal.

11. A successive approximation analog-to-digital conversion method capable of improving the accuracy of analog-to-digital conversion, comprising the following steps:

generating M bits according to an analog input signal by a successive approximation analog-to-digital converting circuit, in which the M bits include a most significant bit (MSB) and successive M−1 bit(s) in succession to the MSB while M is an integer greater than one;

generating a capacitor array output signal according to the analog input signal by a sample and hold circuit of the successive approximation analog-to-digital converting circuit after the generation of the M bits;

accumulating the capacitor array output signal and a comparison signal and thereby generating an accumulation signal by an accumulation signal generating circuit; and generating N bits according to the accumulation signal by a multibit analog-to-digital converting circuit, in which the N bits include a least significant bit (LSB) and successive N−1 bit(s) ahead of the LSB while N is an integer greater than one.

12. The successive approximation analog-to-digital conversion method of claim 11, further comprising:

generating another capacitor array output signal to be the comparison signal according to the analog input signal; or providing a constant signal to be the comparison signal.

13. The successive approximation analog-to-digital conversion method of claim 11, wherein the step of generating the accumulation signal includes:
   generating at least one current signal according to the capacitor array output signal and the comparison signal; and
   generating at least one voltage signal to be the accumulation signal according to the at least one current signal.

14. The successive approximation analog-to-digital conversion method of claim 13, wherein the step of generating the at least one current signal includes:
   generating a first current signal according to the capacitor array output signal; and
   generating a second current signal according to the comparison signal,
   and the step of generating the at least one voltage signal includes:
   generating a first voltage signal according to the first current signal; and
   generating a second voltage signal according to the second current signal.

15. The successive approximation analog-to-digital conversion method of claim 11, wherein the step of generating the N bits includes: executing a time-to-digital conversion operation and thereby generating the N bits according to the at least one voltage signal.

16. The successive approximation analog-to-digital conversion method of claim 15, wherein the time-to-digital conversion operation includes:
   executing a voltage controlled delay operation and thereby generating the N bits according to the at least one voltage signal.

17. The successive approximation analog-to-digital conversion method of claim 11, wherein the step of generating the N bits includes:
   executing a voltage controlled delay operation and thereby generating N output signals according to the at least one voltage signal; and
   storing the N output signals respectively and then outputting the N bits at a time according to a trigger signal.

18. The successive approximation analog-to-digital conversion method of claim 11, wherein the step of generating the M bits includes:
   generating the M bits according to a clock signal and the analog input signal,
   and the step of generating the capacitor array output signal includes:
   generating the capacitor array output signal according to the analog input signal and the clock signal,
   and the step of generating the N bits includes:
   after the generation of the M bits, starting providing another clock signal and then generating the N bits according to the another clock signal and the accumulation signal.

19. The successive approximation analog-to-digital conversion method of claim 11, wherein the step of generating the M bits includes:
   generating the capacitor array output signal according to a first signal of the analog input signal and a first reference signal;
   generating the comparison signal according to a second signal of the analog input signal and a second reference signal; and
   generating the M bits according to the capacitor array output signal and the comparison signal.

20. The successive approximation analog-to-digital conversion method of claim 11, wherein the step of generating the M bits includes:
   generating the capacitor array output signal according to the analog input signal and a reference signal;
   providing a constant signal to be the comparison signal; and
   generating the M bits according to the capacitor array signal and the comparison signal.

* * * * *